United States Patent
Theuss et al.

(10) Patent No.: US 8,580,612 B2
(45) Date of Patent: Nov. 12, 2013

(54) CHIP ASSEMBLY

(75) Inventors: Horst Theuss, Wenzenbach (DE); Georg Meyer-Berg, Munich (DE)

(73) Assignee: Infineon Technologies AG, Neubiberg (DE)

( * ) Notice: Subject to any disclaimer, the term of this patent is extended or adjusted under 35 U.S.C. 154(b) by 155 days.

(21) Appl. No.: 12/370,266

(22) Filed: Feb. 12, 2009

(65) Prior Publication Data

US 2010/0203676 A1   Aug. 12, 2010

(51) Int. Cl.
    *H01L 21/00*       (2006.01)
(52) U.S. Cl.
    USPC .................................. 438/109; 257/E21.599
(58) Field of Classification Search
    USPC .................................. 438/109; 257/E21.599
    See application file for complete search history.

(56) References Cited

U.S. PATENT DOCUMENTS

| | | | | |
|---|---|---|---|---|
| 6,053,395 A * | 4/2000 | Sasaki | ...................... | 228/180.22 |
| 7,605,018 B2 * | 10/2009 | Fan | ................. | 438/106 |
| 7,615,410 B2 * | 11/2009 | Goh et al. | ...................... | 438/108 |
| 2006/0012020 A1 * | 1/2006 | Gilleo | ........................... | 257/678 |
| 2006/0252182 A1 * | 11/2006 | Wang et al. | ..................... | 438/110 |
| 2008/0318364 A1 * | 12/2008 | Foong et al. | .................... | 438/118 |
| 2009/0023243 A1 * | 1/2009 | Koyanagi | ...................... | 438/107 |
| 2009/0061564 A1 * | 3/2009 | Lytle et al. | .................... | 438/113 |
| 2009/0155958 A1 * | 6/2009 | Kolodin et al. | ............... | 438/120 |
| 2009/0186216 A1 * | 7/2009 | Inada et al. | .................... | 428/337 |
| 2009/0218676 A1 * | 9/2009 | Muto et al. | ..................... | 257/693 |
| 2009/0302448 A1 * | 12/2009 | Huang | ........................... | 257/686 |
| 2010/0072594 A1 * | 3/2010 | Kerr et al. | ...................... | 257/678 |
| 2010/0117096 A1 * | 5/2010 | Yoo et al. | ........................ | 257/76 |
| 2010/0193931 A1 * | 8/2010 | Do et al. | ........................ | 257/686 |

OTHER PUBLICATIONS

"Multchip Self-Assembly Technique on Flexible Polymeric Substrate", T. Fukushima, et al., 2008 Electronic Components and Technology Conference.
"New Three-Dimensional Integration Technology Based on Reconfigured Wafer-on-Wafer Bonding Technique", Takafumy Fukushima, et al., 2007 IEEE, IEDM 07 985-988.
"Selective One-step Plasma Patterning Process for Fluidic Self-assembly of Silicon Chips", Karlheinz Bock, et al., 2008 Electronic Components and Technology Conference.

* cited by examiner

*Primary Examiner* — William D Coleman
*Assistant Examiner* — Christine Enad
(74) *Attorney, Agent, or Firm* — Dicke, Billig & Czaja, PLLC

(57) ABSTRACT

A method of manufacturing an array of semiconductor devices comprises providing a first carrier having multiple chip alignment regions. Multiple chips are placed over the multiple chip alignment regions. Then, alignment of the chips to the multiple chip alignment regions is obtained. The multiple chips are then placed on a second carrier. The first carrier is detached from the multiple chips. An encapsulation material is applied to the multiple chips to form an encapsulated array of semiconductor chips. The second carrier is then detached from the encapsulated array of semiconductor devices.

21 Claims, 7 Drawing Sheets

CHIP ASSEMBLY

BACKGROUND OF THE INVENTION

The invention relates to semiconductor manufacturing technology, and more particularly to the improvement of production throughput in semiconductor device assembly processes.

Semiconductor wafers are separated in semiconductor chips, and the chips are then assembled by a variety of techniques to form semiconductor devices. During assembly, the chips have to be placed on a carrier and aligned. The assembly cost strongly depends on the required chip alignment precision, the assembly speed, the assembly technique and other factors. Generally, sequential one-chip assembly and alignment processes are slower and more expensive than parallel multi-chip assembly and alignment techniques.

For these and other reasons, there is a need for the present invention.

BRIEF DESCRIPTION OF THE SEVERAL VIEWS OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description.

DETAILED DESCRIPTION OF THE INVENTION

Figure 1A:
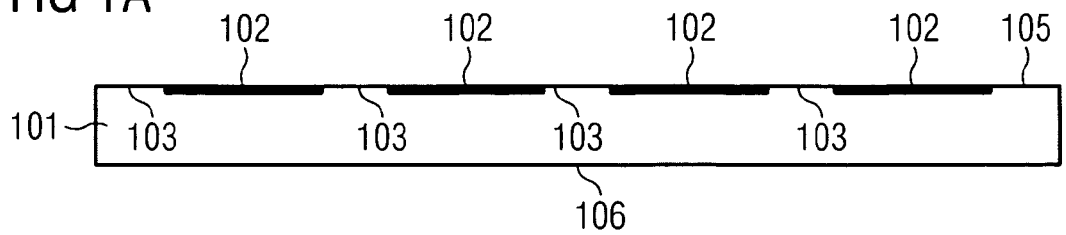
FIGS. 1A to 1G schematically illustrate one exemplary embodiment of a method to fabricate an array of semiconductor devices.

In the following, embodiments of the invention are described with reference to the drawings, wherein like reference numerals are generally utilized to refer to like elements throughout, and wherein the various structures are not necessarily drawn to scale. In the following description, for purposes of explanation, numerous specific details are set forth in order to provide a thorough understanding of one or more aspects of embodiments of the invention. It may be evident, however, to one skilled in the art that one or more aspects of the embodiments of the invention may be practiced with a lesser degree of these specific details. Moreover, features which are only described with respect to a specific embodiment may also be implemented in other embodiments if possible under technical considerations. The following description is therefore not to be taken in a limiting sense, and the scope of the invention is defined by the appended claims.

In the following detailed description, reference is made to the accompanying drawings, which form a part thereof, and in which is shown by way of illustration specific embodiments in which the invention may be practiced. In this regard, directional terminology, such as "upper", "lower", "left-hand", "right-hand", "front side", "backside", etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention.

It is to be understood that the features of the various exemplary embodiments described herein may be combined with each other, unless specifically noted otherwise.

As employed in this specification, the terms "coupled" and/or "electrically coupled" and/or "attached" are not meant to mean that the elements must be directly coupled or attached together; intervening elements may be provided between the "coupled" or "electrically coupled" or "attached" elements.

The semiconductor wafers and chips described further below may be of different types, may be manufactured by different technologies and may include for example integrated electrical circuits, electro-optical circuits, electro-mechanical circuits such as e.g. MEMS (Micro-Electro-Mechanical System) and/or passives. The semiconductor chips may, for example, be configured as power semiconductor chips, such as power MOSFETs (Metal Oxide Semiconductor Field Effect Transistors), IGBTs (Insulated Gate Bipolar Transistors), JFETs (Junction Gate Field Effect Transistors), power bipolar transistors or power diodes. Furthermore, the semiconductor wafers and chips may include control circuits, microprocessors or microelectromechanical components. In particular, semiconductor chips having a vertical structure may be involved, that is to say that the semiconductor chips may be fabricated in such a way that electric currents can flow in a direction perpendicular to the main surfaces of the semiconductor chips. A semiconductor wafer or chip having a vertical structure may have contact elements in particular on its two main surfaces, that is to say on its front side and backside. In particular, power semiconductor chips and corresponding wafers may have a vertical structure. By way of example, the source electrode and gate electrode of a power MOSFET may be situated on one main surface, while the drain electrode of the power MOSFET is arranged on the other main surface. Furthermore, the devices described below may include integrated circuits to control the integrated circuits of other semiconductor chips, for example the integrated circuits of power semiconductor chips. The semiconductor wafers and chips need not be manufactured from specific semiconductor material, for example Si, SiC, SiGe, GaAs, and, furthermore, may contain inorganic and/or organic materials that are not semiconductors, such as for example insulators, plastics or metals.

In several embodiments layers or layer stacks are applied to one another or materials are applied or deposited onto layers. It should be appreciated that any such terms as "applied" or "deposited" are meant to cover literally all kinds and techniques of applying layers onto each other. In particular, they are meant to cover techniques in which layers are applied at once as a whole like, for example, laminating techniques as well as techniques in which layers are deposited in a sequential manner like, for example, sputtering, plating, molding, CVD (Chemical Vapor Deposition), etc.

Furthermore the semiconductor wafers and chips described below may comprise contact elements or contact pads on one or more of their outer surfaces wherein the contact elements serve for electrically contacting the semiconductor chips or other circuits integrated in the semiconductor wafer. The contact elements may have the form of lands, i.e. flat contact layers on an outer surface of the semiconductor wafer or chip. The metal layer(s) of which the contact elements are made may be manufactured with any desired material composition. The metal layer(s) may, for example, be in the form of a layer covering an area. Any desired metal or metal alloy, for example aluminum, titanium, gold, silver, copper, palladium, platinum, nickel, chromium or nickel vanadium, may be used as the material. The metal layer(s) need not be homogenous or manufactured from just one material, that is to say various compositions and concentrations of the materials contained in the metal layer(s) are possible. The contact elements may be situated on the active main surfaces of the semiconductor chips or on other surfaces of the semiconductor chips.

In the following, alignment of chips to chip alignment regions on carriers is described. Alignment may be obtained by fluidic alignment processes in which liquids in any form such as e.g. aqueous or resin based liquids, glue, organic solvents, water etc. are used to align the chips on a patterned surface of a carrier having specific wetting properties. The alignment process may be a self-alignment process which may be promoted by the application of external energy such as vibrational energy, sonic energy, electric or magnetic fields, etc.

The chip alignment regions on a carrier to which the chips align may be made of a material having specific wettability properties, e.g. of a material which is more wettable or hydrophilic than the material of the area surrounding the chip alignment regions. The material of which the chip alignment regions are made may be an insulating material such as e.g. silicon dioxide, or it may be a conductive material such as a metal, e.g. copper. In the first case, by way of example, the carrier may include a silicon dioxide surface which is patterned with a polymer layer such as e.g. a photoresist layer to define the outline of the silicon dioxide surface chip alignment regions. In the second case, by way of example, the carrier may include a dielectric layer such as e.g. a polyimide layer comprising metal-cladded lands to provide for the more wettable or hydrophilic chip alignment regions. Further, the chip alignment regions may be defined or assisted by surface topology such as steps on the surface of the carrier.

FIGS. 1A to 1G schematically illustrate one exemplary embodiment of a method to fabricate an array of semiconductor devices 100. FIG. 1A shows a sectional view of a first carrier 101 having multiple chip alignment regions 102 situated on a front face 105 of the first carrier 101. The first carrier 101 may be made of any suitable material, for instance of a material having a CTE (Coefficient of Thermal Expansion) which is similar to the CTE of the material (e.g. silicon or another material) of a second carrier 110 (FIG. 1D) on which the chips which are to be attached. The chip alignment regions 102 may be represented by surface regions of the front face 105 which are more wettable than the surface regions 103 of the front face 105 outside the chip alignment regions 102. As a result, the first carrier 101 is provided with a surface energy patterned surface at the front face 105. There are many possibilities to provide for different kinds of surface energy patterned surfaces useable for chip alignment purposes. Different materials and/or topologies within chip alignment region 102 and outside chip alignment region 102 (i.e. of region 103) may be used as described above and exemplified in conjunction with FIG. 8.

Figure 3A:
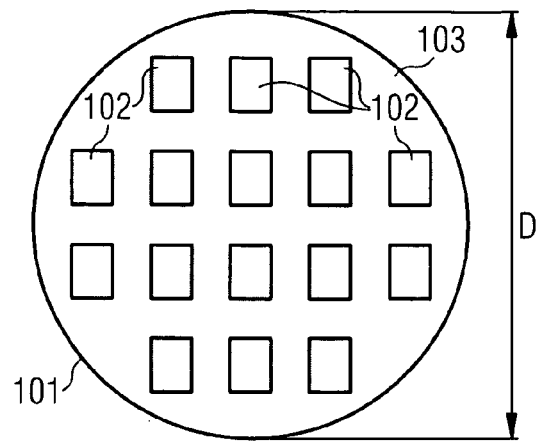
FIG. 3A schematically illustrates a plan view of a carrier shown in FIG. 1A.

The first carrier 101 may e.g. be a disc-shaped plate having a diameter D of e.g. 200 or 300 mm, see FIG. 3A, or may have any other shape such as a polygonal shape having the same or other lateral dimensions. At least two, however typically tens or more than hundred of chip alignment regions 102 are located on the front face 105 of the first carrier 101. The alignment regions 102 must not have the same shape or be arranged in one regular pattern, since different chips and different devices possibly containing more than one chip could be established on the basis of the pattern of the chip alignment regions 102.

Figure 1B:
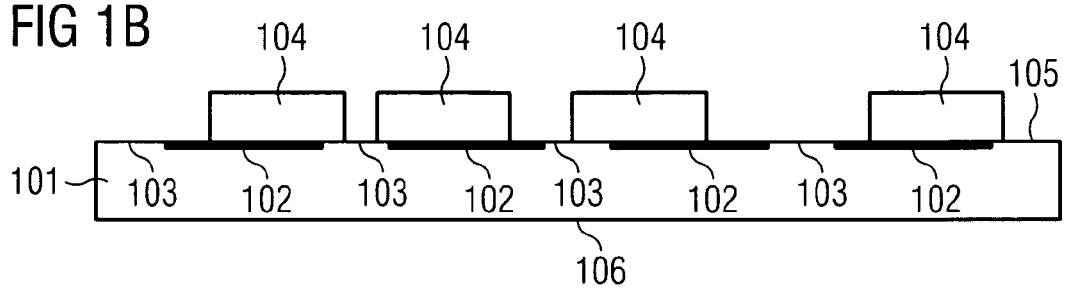

As shown in FIG. 1B, chips 104 are placed on the front face 105 of the first carrier 101. The chips 104 may be placed in a sequential one-by-one chip placement process known as pick-and-place in the art. As will be described later in more detail in conjunction with FIGS. 7A to 7G, it is also possible to use a high-throughput parallel chip placement method.

The chips 104 may be placed face-up or face-down on the front face 105 of the first carrier 101. Face-up placement refers to a chip orientation in which the active surface of the chips 104 faces away from the first carrier 101. Face-down placement refers to a chip orientation in which the active surface of the chips 104 faces the first carrier 101.

Figure 3B:
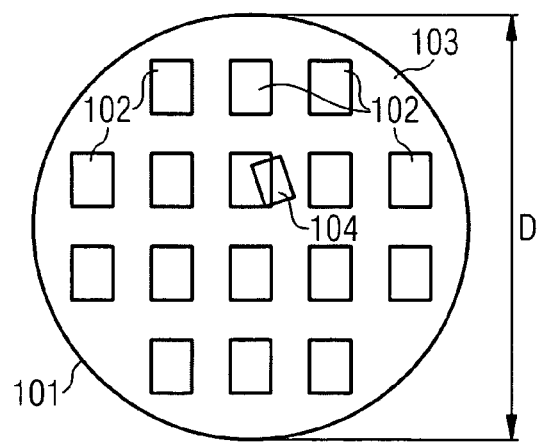
FIG. 3B schematically illustrates a plan view of a carrier shown in FIG. 1B.

Typically, after being placed on the first carrier 101, the chips 104 are only roughly aligned to the chip alignment regions 102. This is shown in FIGS. 1B and 3B (wherein in FIG. 3B, only one misaligned chip 104 is exemplarily depicted). The precision of initial alignment depends on the equipment and method used for placement. If conventional pick-and-place equipment is used, each chip 104 is mechanically aligned on the first carrier 101. If a placement precision of a few micrometers or less were desired as it would be the case without post placement alignment, expensive equipment would be necessary and each placement process would last typically more than 1 second. On the other hand, if low chip placement precision can be tolerated, equipment can be used which operates much faster. By way of example, if a deviation of +30 µm from the ideal position can be tolerated, each placement process can typically be accomplished in less than 0.1 second, resulting in strongly reduced manufacturing cost. Here, initial alignment is not critical because it is sufficient that an overlap between the placed chip 104 and the chip alignment region 102 is obtained. Therefore, cheap and fast chip placement equipment allowing for a deviation of more than ±10 µm or even ±30 µm may be used.

Figure 1C:
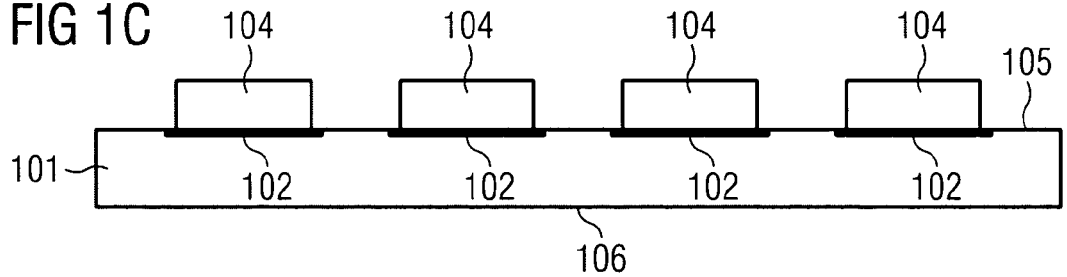
Figure 3C:
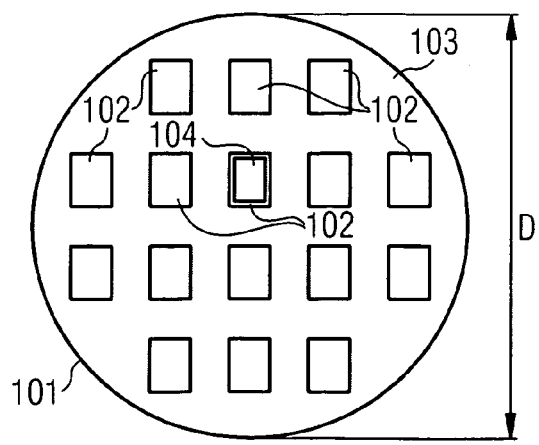
FIG. 3C schematically illustrates a plan view of a carrier shown in FIG. 1C.

After placement of the multiple chips 104 on the first carrier 101, the chips 104 are aligned to the chip alignment regions 102. Alignment can be obtained by various methods. According to one embodiment, a fluidic self-alignment process as indicated above is used. In a fluidic self-alignment process, a small volume of a liquid is dropped on each chip alignment region 102 prior to the chip placement process. As mentioned above, the liquid may be an aqueous liquid, a resin, a nano-paste such as e.g. a silver, gold or copper nano-paste or solder etc. After placing the chips 104 roughly on the chip alignment regions 102, the chips 104 are immediately aligned to the chip alignment regions 102 by virtue of the surface tension of the liquid. The precision and duration of alignment depends on the type of liquid used. For instance, if an aqueous liquid is used, alignment may be obtained within 0.1 seconds, and an alignment accuracy of less than 1 µm may be achieved. When a resin solution is used, the alignment speed is lower but alignment accuracy is enhanced. As already mentioned, alignment may be promoted by the application of external energy. FIGS. 1C and 3C illustrate the first carrier 101 after chip alignment (in FIG. 3C, only one chip 104 is exemplarily depicted). After alignment, the liquid may be removed e.g. by evaporation.

According to another embodiment, the chips 104 may be aligned to the chip alignment regions 102 without the use of a liquid. Alignment may be achieved by the application of magnetic or electrostatic forces and promoted by the application of additional energy such as vibrational energy, sonic energy etc. In this case, the chips 104 may be equipped with a magnetic or conductive element which interacts with a magnetic or electrostatic field used for alignment.

The temporary first carrier 101 is configured to release aligned chips 104 to a second carrier 110. According to one embodiment, the first carrier 101 is configured to apply a low-pressure volume to the multiple chips 104 to secure them to the first carrier 101 and to vent the low-pressure volume to release the chips 104 from the first carrier 101. By way of example, the first carrier 101 may be designed to have a plurality of through holes (not shown) extending from the back face 106 of the first carrier 101 to the front face 105 and opening within the chip alignment regions 102 at the front face 105. In this case, low pressure may be applied to the plurality of through holes from the back face 106 of the first carrier 101. Thus, the through holes act as low-pressure volumes which are in contact with the chips 104 and suck them to the first carrier 101 after alignment has been accomplished. There might be a plurality of through holes per chip alignment region 102. The through holes may e.g. be implemented by a porous material used for the first carrier 101 or by bores penetrating the first carrier 101. A more detailed description of first carrier 101 using vacuum technology to hold the chips 104 in place is presented in conjunction with FIGS. 5A to 5C.

The second carrier 110 may be rigid or may be flexible to a certain degree and may be fabricated from materials such as metals, metal alloys, ceramics or plastics. The second carrier 110 may be electrically conductive or insulating. An adhesive tape (not shown) may be laminated on the front face 115 of the second carrier 110. The adhesive tape may be a double sided sticky tape. Alternatively, a glue material or any other adhesive material or mechanical securing means (such as a clamping device or a vacuum generator) may be associated with the second carrier 110.

Figure 1D:
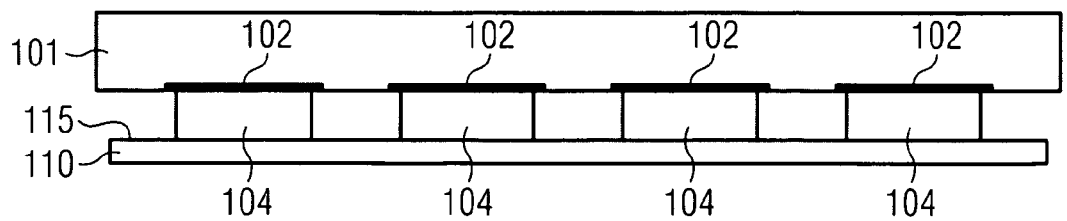
Figure 1E:
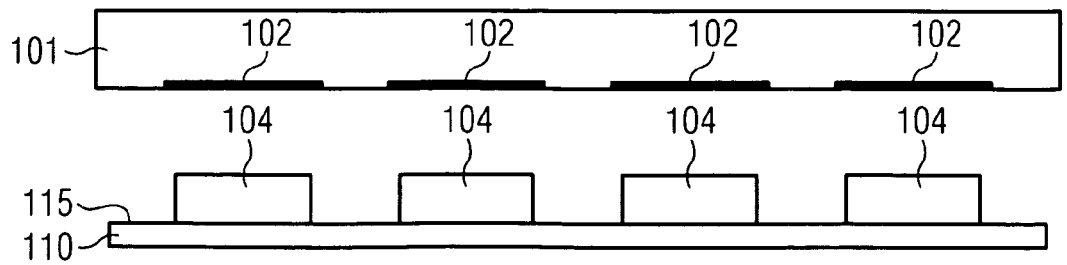

The attachment of the chips 104 to the second carrier 110 and the detachment of the first carrier 101 are shown in FIGS. 1D and 1E. The second carrier 110 may be placed in a position opposite to the first carrier 101. To this end, either the first carrier 101 is turned around and then lowered onto the second carrier 110 as shown in FIG. 1D, or the second carrier 110 is lowered onto the first carrier 101 with the chips 104 oriented on the front face 105 of the first carrier 101 in the upright direction. The chips 104 are attached to the second carrier 110 by a batch process, i.e. in parallel. On pressing the first carrier 101 on the second carrier 110, the adhesive tape (not shown) on the front face 115 of the second carrier 110 fixes the aligned chips 104 on the second carrier 110 in place. As already mentioned, the CTE of the second carrier 110 may match the CTE of the first carrier 101. The second carrier 110 could e.g. be a wafer or a metal plate covered by a foil.

Prior to chip attachment on the second carrier 110, the first carrier 101 and the second carrier 110 may be aligned to each other with high positional accuracy. The positional accuracy depends on the intended application and may be achieved e.g. by optical recognition and controlled positioning.

After the chips 104 are attached to the second carrier 110, the first carrier 101 is detached. If the chips 104 are secured to the first carrier 101 by the application of a vacuum, the vacuum is broken. In another implementation, the chips 104 may be secured to the first carrier 101 by an adhesive, which, by way of example, may become operative on evaporation of the liquid used for alignment. In this case, the chips 104 may be released from the first carrier 101 by supplying a chemical solvent to the interface between the front face 105 of the first carrier 101 and the back surface of the chips 104. After the detachment of the first carrier 101, the chips 104 are located on the second carrier 110 in the same aligned relationship with respect to each other as obtained on the first carrier 101. Thus, the chips 104 are accurately aligned to each other on the second carrier 110 without the need of employing costly high precision pick-and-place alignment tools.

Figure 1F:
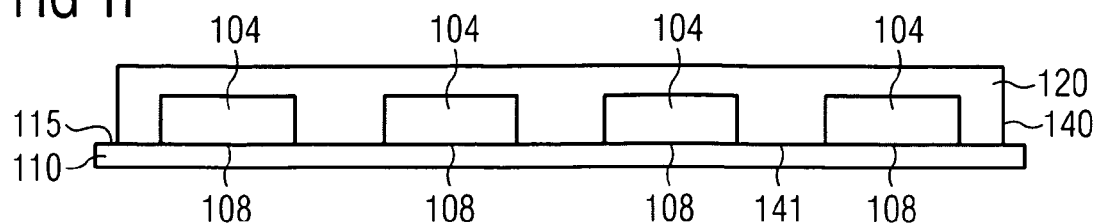

An electrically insulating molding material 120 may be applied to the semiconductor chips 104 and the second carrier 110, see FIG. 1F. The molding material 120 may be used to encapsulate the semiconductor chips 104 except their surfaces which are covered by the second carrier 110. The molding material 120 may be an epoxy or another appropriate material used in contemporary semiconductor packaging technology. It may also be a photoresist such as SU8, which is epoxy-based. The molding material 120 may be composed of any appropriate thermoplastic or thermosetting material. After curing, the molding material 120 provides stability to the array of semiconductor chips 104. Various techniques may be employed to cover the semiconductor chips 104 with the molding material 120, for example compression molding or injection molding.

By way of example, in a compression molding process the liquid molding material 120 is dispensed into an open lower mold half of which the second carrier 110 forms the bottom. Then, after dispensing the liquid molding material 120, an upper mold half is moved down and spreads out the liquid molding material 120 until a cavity between the second carrier 110 forming the bottom of the lower mold half and the upper mold half is completely filled. This process may be accompanied by the application of heat and pressure. After curing, the molding material 120 is rigid and forms a molded body 140. The larger the lateral size of the molded body 140 and the number of embedded chips 104, the more cost efficient the process will typically be. The molded body 140 may have a shape of a disc or plate which may have a lateral dimension of more than 0.2 or even 0.3 m. Such molded bodies 140 accommodating a plurality of spaced-apart redistributed semiconductor chips are often termed "molded reconfigured wafer" in the art.

As may be seen from FIG. 1F, the semiconductor chips 104 may be completely over-molded, i.e. completely covered by molding material 120. By way of example, the molded body 140 in FIG. 1F may have a thickness (in height direction) of about a couple of hundred micrometers, e.g. more than 200 µm, 500 µm or even more than 1000 µm. A small thickness of the molded body 140 may be obtained by optionally grinding the molded body 140 to the desired dimension by using grinding or lapping machines that are similar or identical to the machines used for semiconductor wafer grinding or lapping in frontend technology. The molded body 140 may contain identical chips 104 or may embed different types of chips 104 which could later be interconnected—see e.g. FIGS. 2B or 2C—to form SiPs (System-in-Package).

Figure 1G:
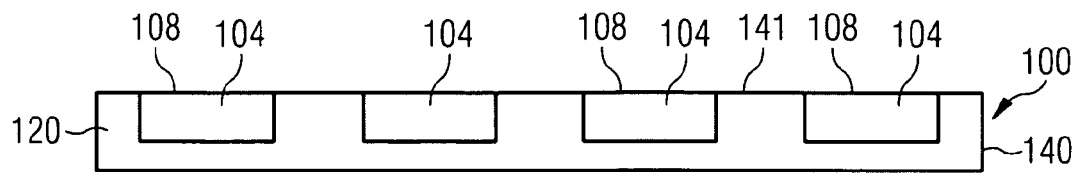

In FIG. 1G, the molded body 140 ("reconconfigured wafer") is released from the second carrier 110. To this end, the adhesive tape (not shown) may feature thermo-release properties, which allow the removal of the adhesive tape during a heat treatment. The removal of the adhesive tape from the molded body 140 including the semiconductor chips 104 is carried out at an appropriate temperature which depends on the thermo-release properties of the adhesive tape and is usually higher than 150° C., in particular approximately 200° C.

Figure 2A:
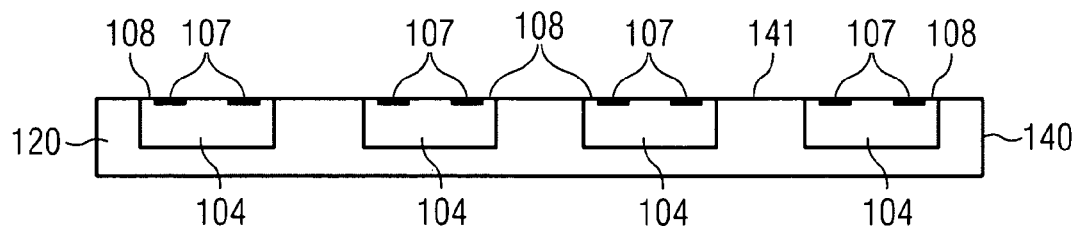
FIGS. 2A to 2B schematically illustrate one exemplary embodiment of a method to apply an electrical wiring to an array of semiconductor devices.
Figure 2B:
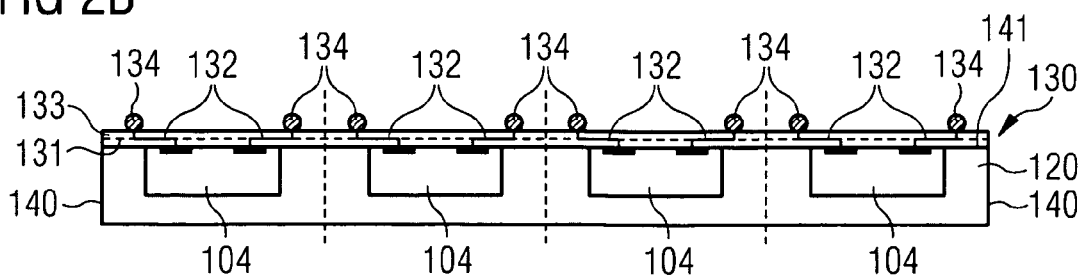

FIGS. 2A and 2B illustrate one exemplary embodiment of a method to apply an electrical wiring to the chips 104 accommodated in the molded body 140. In one implementation, the active surfaces 108 of the chips 104 may be the uncovered bottom surfaces. Contact pads 107 may be located on this surface. The contact pads 107 may remain exposed during the molding process. The active surfaces 108 of the chips 104 may lie flush with the bottom surface 141 of the molded body 140. Over the plane composed of the active surfaces 108 of the chips 104 and the bottom surface 141 of the molded body 140, an electrical redistribution structure 130 containing a first dielectric layer 131, a metal redistribution layer 132 and a second dielectric layer 133 may be formed, compare FIG. 2B. The second, upper dielectric layer 133 may serve as a solder stop when solder balls 134 are optionally applied to exposed regions of the metal redistribution layer 132. The separation line between the second dielectric layer 133 and the first dielectric layer 131 is displayed by a dashed line.

The first and second dielectric layers 131, 133 and the metal redistribution layer 132 may be manufactured in thin-film technology using photo-lithographic structuring techniques. Each of these structuring processes may be performed on the entire molded body 140 ("reconfigured wafer"), i.e. by exposing the entire reconfigured wafer 140 by a global mask process rather than by exposing the single chips 104 individually by a mask process in a sequential manner. Therefore, the locations of the chips 104 in the molded body 140 should correspond as precisely as possible to the intended locations which are used for designing the mask or masks for the thin-film structuring processes. The deviation between the actual chip locations and the expected (i.e. mask-implemented) chip locations should be less than about a few micrometers in order to guarantee proper alignment between the chips 104 and the electrical redistribution structure 130. As explained above, such degree of accuracy can easily be achieved by the chip alignment carried out on the first carrier 101 and transferred to the second carrier 110.

The molded body 140 may be cut into single or multi-chip devices as indicated by the vertical dashed lines in FIG. 2B. Fan-out type packages may be generated. Fan-out type packages are packages embedding a chip 104, wherein at least some of the package terminals (e.g. solder bumps 132) and/or conducting lines of the redistribution layer 132 connecting the chip 104 to the package terminals are located laterally outside of the outline of the chip 104 or do at least intersect the outline of the chip 104. Thus, in fan-out type packages, a peripherally outer part of the package of the chip 104 is typically (additionally) used for electrically bonding the package to external applications such as e.g. application boards etc. This outer part of the package encompassing the chip 104 effectively enlarges the contact area of the package in relation to the footprint of the chip 104, thus leading to relaxed constrains in view of package pad size and pitch with regard to later processing, e.g. second level assembly.

Figure 2C:
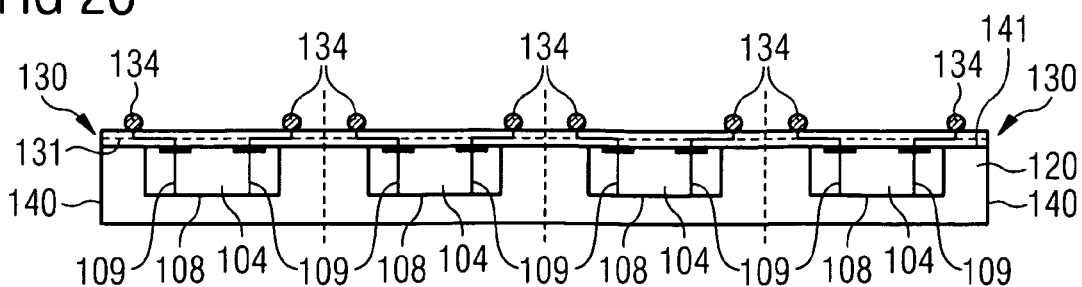
FIG. 2C schematically illustrates one exemplary embodiment of a method to apply an electrical wiring to an array of semiconductor devices.

FIG. 2C shows one exemplary embodiment of a method to apply an electrical wiring to an array of semiconductor devices. As already illustrated in FIGS. 2A and 2B, an electrical redistribution structure 130 containing a first dielectric layer 131, a metal redistribution layer 132 and a second dielectric layer 133 may be generated on the molded body 140. In this implementation, the active surfaces 108 of the chips 104 may be the surfaces of the chips 104 which are covered by mold material 120. In this case, electrical connectivity from the active surfaces 108 of the chips 104 to the metal redistribution layer 132 has to be provided. According to one implementation, which is exemplified in FIG. 2C, this connectivity may be implemented by (conductive) through vias 109 penetrating the chips 104. Silicon chips 104 having such through vias are referred to as TSV (Through-Si-Via) chips in the art. The through vias 109 may be fabricated during wafer processing. According to another implementation (not shown), the connectivity between the active surfaces 108 of the chips 104 and the metal redistribution layer 132 may be implemented by conducting elements running through the molded body 140. These elements may be arranged lateral to each chip 104 and may be realized by bores in the molded body 140 which are filled with a conductive material, e.g. a metal. After application of the redistribution structure 130, the molded body 140 may be singularized into discrete semiconductor devices having one or more chips 104 along the dashed vertical lines.

In other words, FIGS. 1 and 2 illustrate various embodiments to generate fan-out type packages by applying embedded device technology based on a molded reconfigured wafer. This embedded device wafer level packaging (eWLP) technology has been developed from standard wafer level packaging (WLP) technology. Standard WLP technology is defined such that virtually all technology steps are performed on wafer level. Consequently, standard WLPs are always fan-in solutions. In contrast to WLP technology, in eWLP technology the front-end processed and probed wafer is first singulated to obtain the single chips 104. The chips 104 are then embedded in a spaced-apart array-like fashion into the mold material 120 to form the reconfigured wafer (molded body 140), wherein alignment of the chips 104 is accomplished by the use of an auxiliary (first) carrier 101 as described above. This reconfigured wafer (molded body 140) is then processed according to WLP backend technology, e.g. by the application of the electrical redistribution structure 130 and/or external terminals such as e.g. solder bumps 134.

Figure 4A:
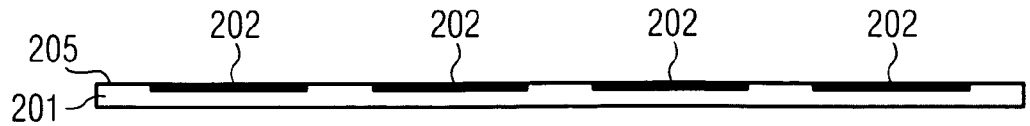
FIGS. 4A to 4E schematically illustrate one exemplary embodiment of a method to fabricate an array of semiconductor devices.

FIGS. 4A to 4E illustrate one embodiment of a method to fabricate an array of semiconductor devices 200. FIG. 4A shows a sectional view of a carrier 201 having multiple chip alignment regions 202 situated on a front face 205 of the carrier 201. The carrier 201 may be made of the same materials as already described in relation to first carrier 101 and/or second carrier 110. Further, die chip alignment regions 202 may be implemented and designed to be identical to the chip alignment regions 102 as described above. In particular, these chip alignment regions 202 may be implemented as self-alignment structures using an intermediate liquid disposed on a surface which is more wettable than the surface outside of the chip alignment regions 202. Additionally or alternatively, the chip alignment regions 202 may be implemented by dry alignment techniques as described above. For instance, dry alignment may be achieved by providing an air cushion between the chips 104 and the chip alignment regions 202 as will be explained in more detail further below. Anyway, the carrier 201 defines an array of aligned positions according to which chips 104 are to be adjusted.

Figure 4B:
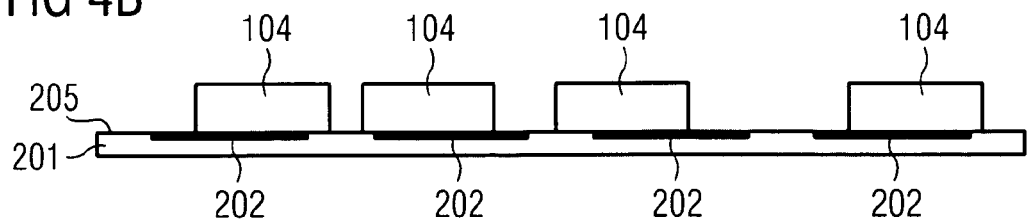

According to FIG. 4B, the chips 104 are placed on the front face 205 of the carrier 201. The placement of the chips 104 may be accomplished in the same way as described in conjunction with FIG. 1B, e.g. in a sequential or in a parallel process.

Chip placement may be performed in face-up or face-down orientation. Thus, all types of chips 104 and both orientations thereof may be used. Again, reference is made to the above description for the sake of brevity.

Figure 4C:
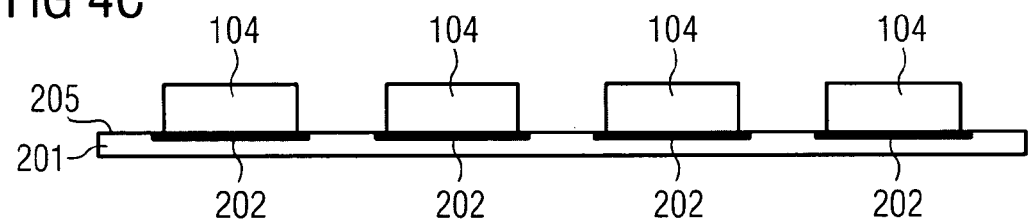
Figure 4D:
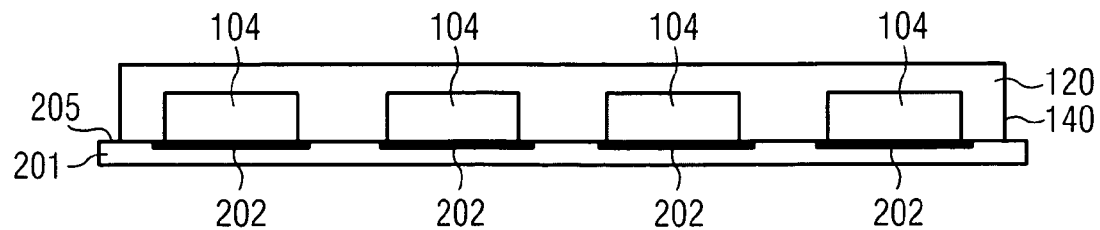

FIG. 4C illustrates the arrangement shown in FIG. 4B after chip alignment. The chips 104 are aligned to the chip alignment regions 202. All description and dimensional quantities relating to chip alignment in previously described embodiments are applicable to the embodiment shown in FIGS. 4A to 4E.

After alignment, the chips 104 which are placed on carrier 201 may be completely over-molded to form a molded body 140. All measures for over-molding chips 104 which have been described in conjunction with previous embodiments are applicable. After curing the molding material 120, the molded body 140 ("reconfigured wafer") is obtained. All steps in relation to this process may be accomplished as described earlier herein.

Thus, it is to be noted that the carrier 201 combines the functionalities of first carrier 101 and second carrier 110. On the one hand, carrier 201 provides an alignment tool, and on the other hand, carrier 201 provides a support or platform for over-molding the chips 104 to form the molded body 140.

The chips 104 must stay in place during over-molding. This can be achieved by using an alignment method which simultaneously provide for tight bonding of the chips 104 on the carrier 201. For instance, if using an aqueous liquid for fluidic alignment, the bonding strength may be enhanced by adding an HF solution to the liquid. According to another possibility, resin solutions comprising an adhesive resin and/or organic solvents may provide for high adhesion strength after alignment. Thus, bonding to the carrier 201 may be simply accomplished by evaporation or curing of the liquid used for fluidic alignment. However, there are also other possibilities to fix the chips 104 in position after alignment. For instance, after alignment it is possible to bond the chips 104 to the carrier 201 by deposition of a layer which covers the surface 205 of the carrier 201 and the chips 104 to hold the chips 104 in place on the carrier 201. The layer may e.g. be made of a dielectric material deposited by a CVD (Chemical Vapor Deposition) or PVD (Physical Vapor Deposition) process.

Figure 4E:
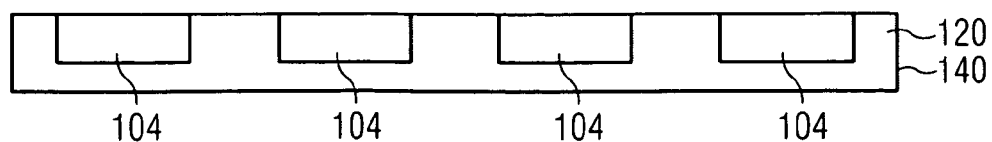

FIG. 4E corresponds to FIG. 1G and illustrates the molded body 140 when released from the carrier 201. After molding, the molded body 140 is separated from the carrier 201. Separation may be accomplished by the application of external energy such as lateral pressure, vibrational energy, sonic energy, heat or a combination of these forms of energy. For instance, if an adhesive resin or a dielectric layer have been used to bond the chips 104 to the carrier 201, the application of heat may substantially weaken the bonding force to allow the carrier 201 to be easily detached from the molded body 140.

The molded body 140 shown in FIG. 4E is similar to the molded body 140 shown in FIG. 1G, and it may contain identical chips or SiPs. As a consequence, all further processing steps explained in detail in relation to FIGS. 2A to 2C may follow. To avoid reiteration, reference is made to the corresponding description herein.

Figure 5A:
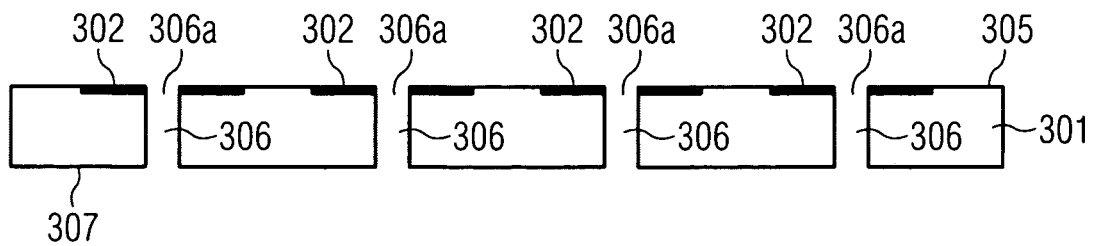
FIGS. 5A to 5C schematically illustrate one exemplary embodiment of a method and a device to hold and align multiple chips.
Figure 5B:
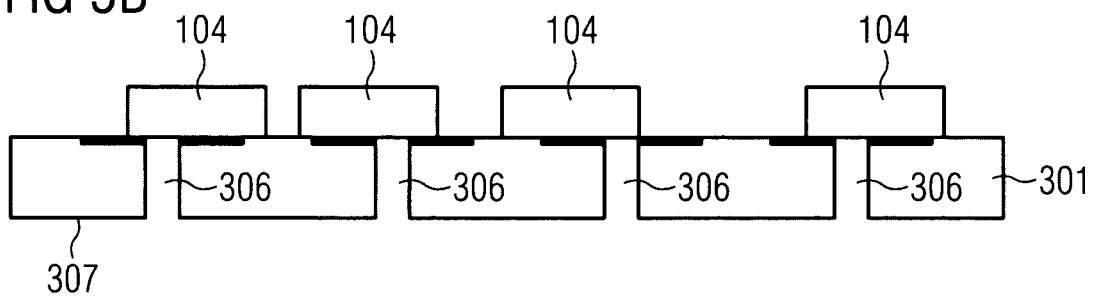
Figure 5C:
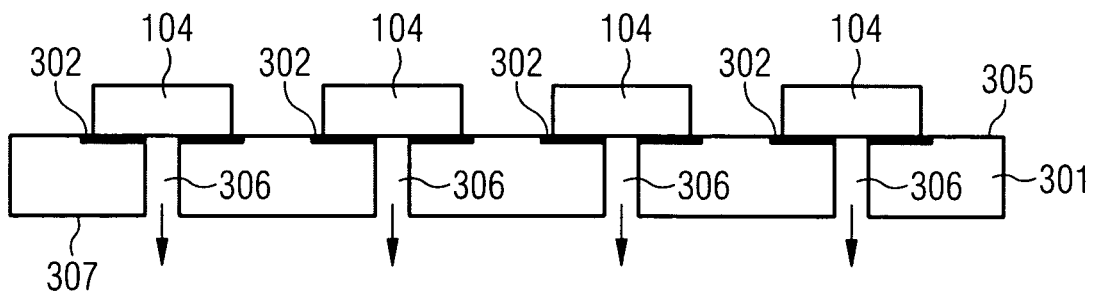

FIGS. 5A to 5C illustrate one embodiment of a method and to hold and align multiple chips 104. Further, a carrier 301 for holding and aligning chips 104 is exemplified. The carrier 301 comprises an upper surface 305 and chip alignment regions 302 arranged on this surface 305. The surface 305 and the chip alignment regions 302 may be identical to the surface 105 and chip alignment regions 102 as described earlier. Further, the carrier 301 may be identical to carrier 101 as described above. In particular, the carrier 301 may be made of the same materials as mentioned in relation to the first carrier 101.

Carrier 301 is equipped with a low-pressure or vacuum holding facility. To this end, the carrier 301 comprises volumes or voids 306 which open to the chip alignment regions 302 and may be pressurized or vented by suitable equipment. For instance, volumes 306 may be designed as through-holes extending from the surface 305 to the opposite surface 307 of the carrier 301. By way of example, a pressure chamber (not shown) may be attached to the surface 307 of the carrier 301 and connected to the volumes (e.g. through-holes) 306. By decreasing the pressure in the pressure chamber (not shown) at the backside of the carrier 301, the pressure in the volumes 306 is lowered and thus, a chip 104 which covers the opening 306a of the volume 306 at the surface 305 may be sucked to the carrier 301. It is to be noted that one or a plurality of volumes or through-holes 306 may be provided per chip alignment region 302. Further, according to one implementation, the whole carrier 301 may be made of a porous material, e.g. a ceramic material, so that a pressure applied to the backside (surface 307) of the carrier 301 is operatively available at the front surface 305 of carrier 301 and in particular within the chip alignment regions 302 thereof.

Chip placement and chip alignment in FIGS. 5B and 5C are performed in the same way as described earlier. Optionally, chip alignment may be promoted or rendered possible by applying a pressure to the volumes 306. The pressure may serve as an air cushion for alignment or may prevent liquid used for alignment to clear away into the volumes 306. After chip alignment (FIG. 5C) the chips 104 are sucked to the carrier 301 by lowering the pressure within the volumes 306 according to the arrows. With depressurized volumes 306, the chips 104 are securely held in their aligned positions on carrier 301. Carrier 301 may then be manipulated, e.g. transferred to another location or turned over. When the carrier 301 has been transferred to its target location, the volumes 306 may be vented (see arrows) resulting in that the chips 104 are released from the carrier 301. As already described in conjunction with FIGS. 1D and 1E, the chips 104 may then be placed in an aligned relationship on any kind of carrier 110, e.g. a wafer, a metal or metal alloy plate, a ceramic plate or a laminate. Vice versa, it is to be noted that this technique (alignment and vacuum application) may be used in the method steps shown in FIGS. 1C to 1E. In other words, the first carrier 101 which may be equipped to align and securely transfer chips 104 to the second carrier 110 may be implemented with a vacuum or low-pressure facility as described in conjunction with FIGS. 5A to 5C.

Figure 5D:
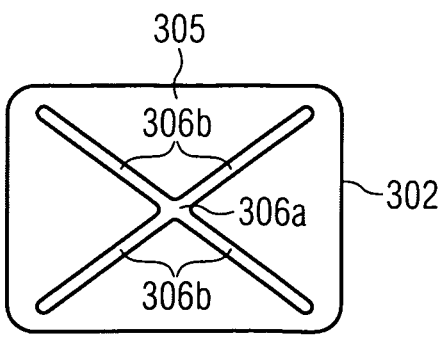
FIG. 5D is a plan view of one exemplary implementation of a chip alignment region equipped with a low-pressure facility.

FIG. 5D is a plan view of one exemplary implementation of a chip alignment region 302 connected to a low-pressure facility. The opening 306a of the volume 306 opens at the surface 305 within the chip alignment region 302, e.g. at the center thereof, and may be connected to shallow trenches 306b which may extend e.g. to the corners of the chip alignment region 302 or may be distributed in another pattern across the chip alignment region 302. The shallow trenches 306b may have a depth of only about 10 to 30 µm in order to avoid large amounts of liquid so gather therein. On the other hand, the trenches 306b should extend along substantial parts of the dimensions of the chip alignment region 302 to be effective.

Figure 6:
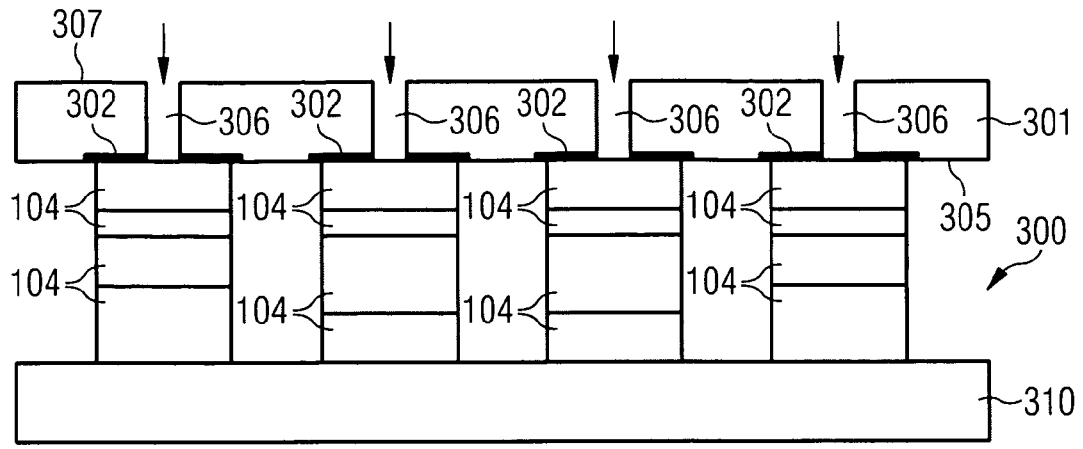
FIG. 6 schematically illustrates one exemplary embodiment of a method to fabricate a semiconductor device made of a plurality of stacked chips.

FIG. 6 illustrates one embodiment of a semiconductor device 300 comprising of an array of vertically stacked chips 104. The vertically stacked chips 104 are established on a carrier 310 which serves as a mounting platform. The carrier 310 may be made of a semiconductor wafer or any other substrate such as e.g. a leadframe, a PCB (Printed Circuit Board), a SBU (Sequential Build-Up) laminate substrate, a ceramic substrate, a mold compound, e.g. MID (Molded Interconnect Device), etc. The chips 104 may be of different materials, different sizes and different functionalities. For instance, as in the foregoing description, each of the chips 104 may be one of the group of a MEMS chip, a sensor chip, an RF-chip, a power chip, a logic chip, a microprocessor or a memory chip such as e.g. a flash memory chip, a SRAM memory chip or a DRAM memory chip. The array of stacked chips 104 may exclusively contain KGDs (Known Good Dies). The active surface of the chips 104 may either be on the bottom side or on the top side. The chips 104 may be designed by TSV technology in order to electrically contact each chip 104 to the neighbouring lower and upper chips 104. Some of the chips 104 may also have a vertical structure with electrodes provided on both sides of the chip 104.

FIG. 6 illustrates the attachment of upper chips 104 held by the carrier 301 (see FIG. 5C) to an already fabricated array of stacked chips 104. To this end, the carrier 301 holding the aligned chips 104 (e.g. by vacuum technology) is precisely aligned to carrier 310 and lowered to the already fabricated array of stacked chips 104 mounted thereon. The precision of alignment between stacked chips 104 may be considerably high (e.g. less than about 3 μm) in order to guarantee that the contact pads (not shown) of adjacent chips 104 match in position. Otherwise, the semiconductor device 300 would not be reliably wired. Therefore, highly accurate self-alignment on the carrier 301 and highly accurate alignment between carrier 301 and carrier 310 is used.

After bonding the uppermost chips 104 to the already fabricated array of stacked chips 104, the carrier 301 is detached from the array of chips 104. To this end, the volumes 306 sucking the chips 104 to the carrier 301 are vented. The carrier 301 may then be used to align and transfer a new layer of chips 104 to the already fabricated array of stacked chips 104. Again, chips tested to be KGDs from different wafers could be arranged on the carrier 301 to form the next building layer of the device 300.

Subsequently, when the last building layer of chips 104 has been attached to the device 300, the device 300 may be encapsulated in a molding compound and separated into single devices (i.e. columns of stacked chips 104) by any appropriate singularization method such as mechanical dicing or laser dicing.

It is to be noted that the stacked chips 104 of one column (or optionally of all columns) may have the same lateral sizes. Further, the distance between adjacent columns of chips 104 in FIG. 6 may have the dimension of the width of a dicing street. That is, the carrier 310 may be a wafer containing preprocessed integrated circuits distributed in a conventional spaced-apart relationship so as to leave space for dicing between the integrated circuits, and the chips 104 are stacked on these integrated circuits provided in the bottom wafer 310. Thus, the distance between adjacent columns of chips 104 in FIG. 6 may e.g. be as small as 50 to 100 μm. Then, column separation is accomplished by dicing the bottom wafer 310 as indicated above. That way, e.g. DRAM-chip columns or chip columns containing a number of different integrated circuits could be generated on wafer level.

Throughout all embodiments in the foregoing description, the loading of the carrier 101, 201, 301 used for chip alignment could be accomplished in a sequential manner (e.g. by picking KGD-chips from one or many wafers and placing them on the carriers 101, 201, 301) or in a parallel placement process. FIGS. 7A to 7F illustrate one embodiment of a parallel placement process to a chip alignment carrier 401. The chip alignment carrier 401 may be one of the carriers 101, 201, 301 or any other type of alignment carrier having chip alignment regions 402 corresponding to chip alignment regions 102, 202, 302 as described above.

Figure 7A:
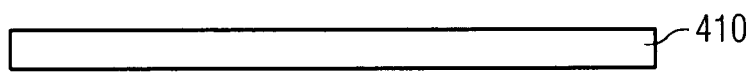
FIGS. 7A to 7G schematically illustrate one exemplary embodiment of a method to produce an aligned array of chips.

First, a semiconductor wafer 410 is provided, see FIG. 7A. The semiconductor wafer 410 may be fabricated by frontend processing and may contain any type of integrated devices as mentioned earlier.

Figure 7B:
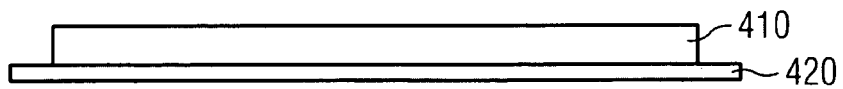

The semiconductor wafer 410 is then attached to an expandable carrier 420 (FIG. 7B). The expandable carrier 420 may be an expandable tape, foil or sheet made of any suitable material such as e.g. an elastic polymer material, a rubber material, etc.

Figure 7C:
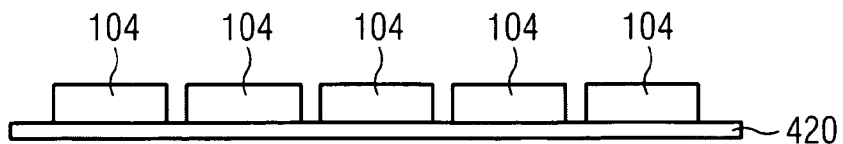

According to FIG. 7C, the semiconductor wafer 410 is then diced into separate chips 104. Dicing may be accomplished by a conventional dicing method, e.g. by sawing, or by laser dicing. By way of example, a stealth dicing process may be employed in which a laser beam is used to produce a weakening zone along the cutting lines in the semiconductor wafer 410. In contrast to other dicing methods, in which the chips 104 are already physically separated during dicing, the semiconductor wafer 410 still remains integral during stealth dicing.

Figure 7D:
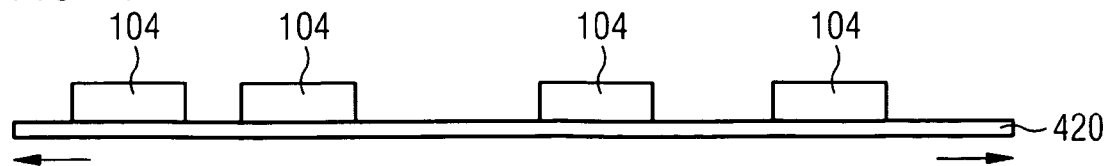

FIG. 7D illustrates chip separation by carrier 420 expansion. During carrier expansion, the space between chips 104 is enlarged. If the semiconductor wafer 410 was still integral after dicing (e.g. as it is the case in stealth dicing), the expansion of carrier 410 additionally serves to separate the semiconductor wafer 410 in single chips 104. Carrier 420 expansion is indicated in FIG. 7D by arrows.

After expansion of the carrier 420, the chips 104 are distributed over the surface of the expanded carrier 420. The distribution may not be ideally regular, meaning that the distance between adjacent chips 104 may vary, see FIG. 7D.

Figure 9A:
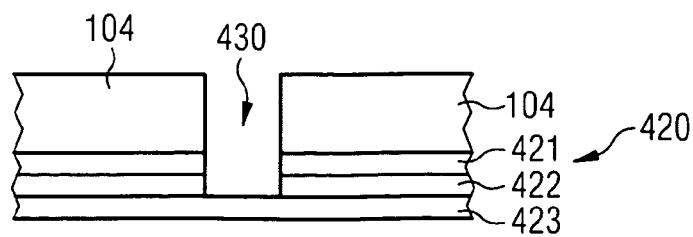
FIGS. 9A and 9B schematically illustrate exemplary embodiments of expandable carriers.
Figure 9B:
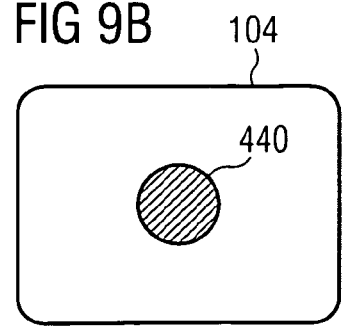

In some embodiments, the mean distances between the expanded chips 104 on the expanded carrier or foil 420 should be larger than the distances which are typically available by conventional wafer mount tape expansion. In order to increase the expandability of the carrier 420, various approaches are proposed. A first possibility is to use a carrier material such as e.g. a thermoplastic material which is more expandable than the materials commonly used for expandable carriers (i.e. chip mounting tapes). Second, a carrier 420 having a high thickness of more than 300 or 500 μm may be used. The thicker the expandable carrier 420 the higher is the expandability of the carrier 420. Third, a multi-layer expandable carrier 420 as shown in FIG. 9A may be employed. Expandable carrier 420 may comprise an upper adhesive layer 421, a lower expansion layer 423 and an intermediate layer 422. By way of example, the upper adhesive layer 421 may be made of an acrylic material and the intermediate layer 422 may be made of a material conventionally used for mounting tapes, such as PVC, PET or PO. The lower expansion layer 423 may be made of a thermoplastic material and/or a silicone based material having a higher elasticity and/or expandability than the intermediate layer 422. During wafer dicing, the top adhesive layer 421 and the intermediate layer 422 are separated along the dice street 430. However, the highly elastic and/or expandable lower layer is preserved. Then, on carrier 420 expansion, the highly elastic and/or expandable lower layer 423 is effective to space the chips 104 widely apart. The thickness of layers 421, 422, 423 may each be in the range between 10 to 100 μm. A further possibility to enhance the separability of the chips is to use a multi step UV exposure technique for releasing the chips 104 from the expandable carrier 420. FIG. 9B is a plan view showing the outline of a chip 104 on the expandable carrier 420 after dicing and before expansion, compare FIG. 7C. In a first step, the backside of the expandable carrier outside of the central region 440 is exposed by UV light, resulting in that the adhesive on the front side of the expandable carrier 420 is disabled or rendered inoperative in the exposed area outside central region 440. Thus, the chips only remain glued to the expandable carrier 420 within the central region 440. The backside of the expandable carrier 420 may be exposed in a pattern to support the evenly distribution of chip 104 positions after expansion. Then, the expandable carrier 420 is expanded. With the exception of the central regions 440, the expandable carrier 420 may expand across all area, even within the area exposed by UV light under the chips 104. Thus, the expandable area of the carrier 420 is enlarged by the first UV light exposure step, resulting in enhanced chip separation. After expansion, a second UV light exposure of the entire backside of the (expanded) carrier 420 is used to release the chips 104 from the carrier 420.

It is to be noted that two or more of the above approaches to enhance the mean distance between adjacent chips after expansion may be combined, if desired. Generally, an elongation of 1000% or more may be achieved.

Figure 7E:
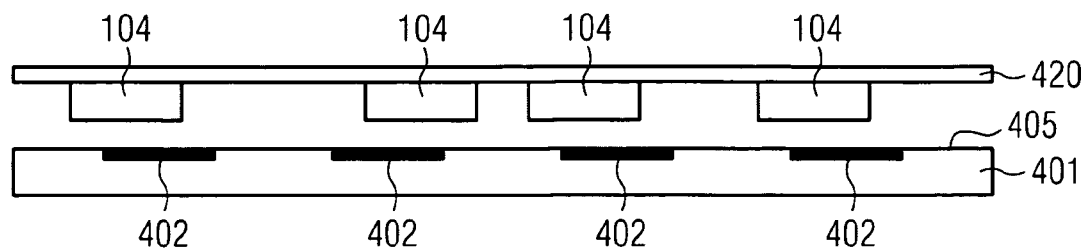
Figure 7F:
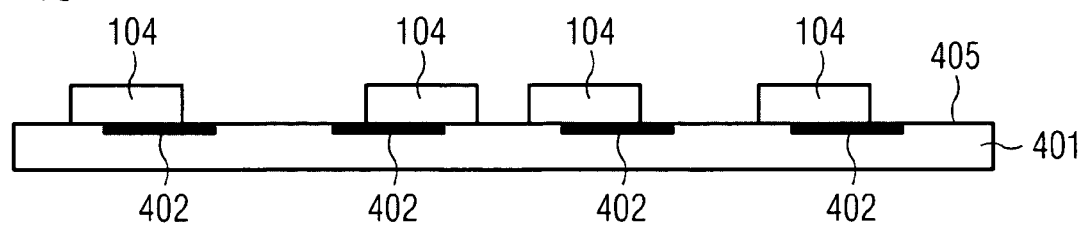
Figure 7G:
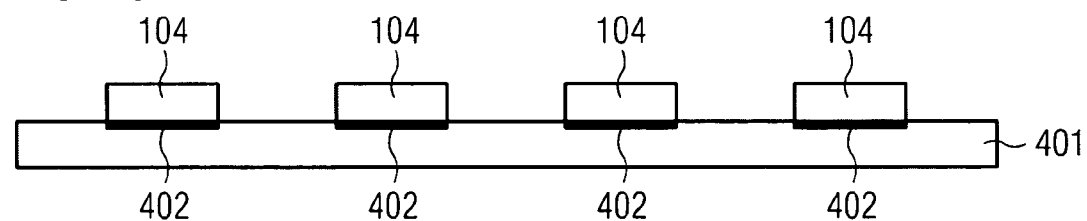

Relating to FIG. 7E, the chips 104 on the expanded carrier 410 are then jointly placed on an alignment carrier 401 having chip alignment regions 402 as explained above. The locations of the chip alignment regions 402 on the surface 405 of the alignment carrier 401 are designed to match to the expected positions of the chips 104 on the expanded carrier 410. According to one implementation, the expected positions of the chips 104 on the expanded carrier 410 may be distributed in a regular array, i.e. in an array having equal distances between each expected chip position. In this case, the chip alignment regions 402 on carrier 401 are also configured in a regular array having the same distance between adjacent chip alignment regions 402. According to another implementation, the expansion of the carrier 420 may be non-conforming resulting in that the expected distances between adjacent chips 104 on the expanded carrier 420 are a function of the initial position of the chip 104 in the wafer 410 (i.e. on the carrier 410) before expansion (FIG. 7C). By way of example, neighbouring chips 104 near to the edge of the semiconductor wafer 410 may be spaced apart a longer distance than chips 104 in the vicinity of the center of the semiconductor wafer 410. In this case, the chip alignment regions 402 on the alignment carrier 401 are designed to match to the expected chip positions after carrier expansion based on the expansion characteristics of the expandable carrier 420. In other words, systematic variations of the distances between adjacent chips 104 after expansion may be taken into account when designing the alignment carrier 401. However, carrier 420 expansion will usually result in additional positioning tolerances of the chips 104 which are unknown before carrier 420 expansion and can not be taken into account when designing the pattern of the chip alignment regions 402 on carrier 401.

As shown in FIG. 7E, the chips 104 on the expanded carrier 420 are then transferred to the alignment carrier 401 and placed on the surface 405 thereof. To this end, either the expanded carrier 420 with chips 104 is flipped and lowered onto the alignment carrier 401 or the alignment carrier 401 is flipped and lowered onto the expanded carrier 420 carrying the chips 104. The transfer of the chips 104 from the expanded carrier 420 to the alignment carrier 401 can be done by the whole wafer (i.e. all chips 104 of a wafer 410 are transferred) or by suitable parts of the semiconductor wafer 410. However, at least two chips 104 are placed in parallel (jointly) onto the alignment carrier 401. As shown in FIG. 7E, the initial (low precision) alignment between the chips 104 on the expanded carrier 420 and the chip alignment regions 402 on chip alignment carrier 401 should be at least that good so as to provide an overlap between the footprint of each chip 104 and the corresponding chip alignment region 402.

The expanded carrier 420 is then detached by any suitable process e.g. under application of external energy such as heat or UV light in order to weaken or neutralize the bonding strength between the chips 104 and the expanded carrier 420. The expanded carrier 420 may then be removed and the multiple chips 104 are aligned by virtue of the chip alignment regions 402 according to any of the processes described above. After alignment, the alignment carrier 401 may be used in any of the embodiments described above, e.g. as a transfer carrier similar to carriers 101, 301 or as a chip carrier which is used for over-molding chips 104 in eWLB technology as represented by way of example by carrier 201.

It is to be noted that throughout all embodiments, initial placement tolerances which might be about nearly the size of lateral chip dimension (i.e. more than 100 μm) may be reduced to positional tolerances of less than 1 m by the alignment process described herein. However, in some cases as e.g. eWLB applications, positional tolerance of more than 3, 5 or even 10 μm may be acceptable so that the requirements to positional accuracy may be significantly lower than in the stacked chip device 300 shown in FIG. 6.

Figure 8:
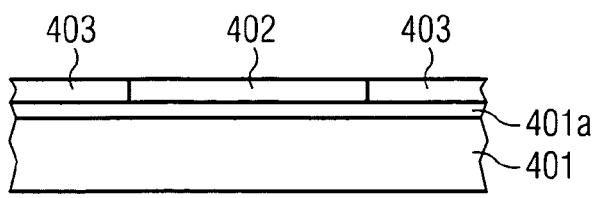
FIG. 8 schematically illustrates an embodiment of a chip alignment region on a carrier.

FIG. 8 illustrates a sectional view of the carrier 401 equipped with a chip alignment region 402. The carrier 401 may be covered by a dielectric layer 401a made e.g. by a polymeric material such as polyimide. The chip alignment regions 402 may be made of a thin $SiO_2$ layer of e.g. rectangular shape. The thin $SiO_2$ layer may be generated by plasma enhanced chemical vapor deposition (PECVD). The chip alignment region 402 is highly wettable or hydrophilic. The chip alignment region 402 is surrounded by less wettable or hydrophobic areas 403 which may be made of a polymeric material. The chip alignment region 402 and the surrounding areas 403 may be photolithographically patterned on the dielectric layer 401a, and thus their dimensions may be precisely defined.

In addition, while a particular feature or aspect of an embodiment of the invention may have been disclosed with respect to only one of several implementations, such feature or aspect may be combined with one or more other features or aspects of the other implementations as may be desired and advantageous for any given or particular application. This application is intended to cover any adaptations or variations of the specific embodiments discussed herein, and the invention is intended to be limited only by the claims and the equivalence thereof.

What is claimed is:
1. A method of manufacturing an array of semiconductor devices, comprising:
providing a first carrier with a surface having multiple chip alignment regions, wherein the chip alignment regions comprise surface areas of the first carrier which are more hydrophilic than a remaining surface area of the first carrier surrounding the chip alignment regions;

disposing a fluid on the multiple chip alignment regions of the first carrier;
simultaneously placing multiple chips onto the fluid over the multiple chip alignment regions of the first carrier, one chip for each chip alignment region;
aligning each chip to the corresponding chip alignment region by applying an external energy to laterally move and align each chip via the fluid, wherein the lateral movement is relative to the surface of the first carrier;
placing the aligned multiple chips on a second carrier;
detaching the first carrier from the aligned multiple chips after placing the aligned multiple chips on the second carrier;
applying an encapsulation material to the aligned multiple chips after detaching the first carrier to form an encapsulated array of semiconductor devices; and
detaching the second carrier from the encapsulated array of semiconductor devices.

2. The method of claim 1, further comprising:
generating an electrical redistribution layer over the encapsulated array of semiconductor devices.

3. The method of claim 1, further comprising:
detachably securing the multiple chips to the first carrier after alignment.

4. The method of claim 3, further comprising:
applying a low-pressure gas volume to the multiple chips for detachably securing them to the first carrier.

5. The method of claim 1, wherein the multiple chips are placed over the multiple chip alignment regions of the first carrier in an orientation in which active surfaces of the multiple chips face away from the first carrier.

6. The method of claim 1, wherein the multiple chips comprise vias extending from active surfaces of the multiple chips to opposite surfaces of the multiple chips.

7. The method of claim 1, wherein the multiple chips are placed over the multiple chip alignment regions in parallel.

8. The method of claim 1, further comprising:
providing a semiconductor wafer;
attaching the semiconductor wafer on an expandable carrier;
singularizing the semiconductor wafer into multiple chips;
expanding the expandable carrier to space apart the multiple chips; and
placing the spaced apart multiple chips in parallel over the multiple chip alignment regions of the first carrier.

9. The method of claim 1, wherein the external energy comprises one of vibrational energy, sonic energy, electric energy, and magnetic energy.

10. A method of manufacturing an array of semiconductor devices, comprising:
providing a carrier having multiple chip alignment regions on a front face of the carrier, wherein the chip alignment regions comprise surface areas of the front face which are more hydrophilic than a remaining surface area of the front face surrounding the chip alignment regions;
disposing a fluid on the multiple chip alignment regions;
simultaneously placing multiple chips onto the fluid over the multiple chip alignment regions, one chip for each alignment region;
aligning each chip to the corresponding chip alignment region via the fluid;
applying a low-pressure gas volume from a back face of the carrier to each chip via at least one opening extending through the carrier from the back face to the front face to each chip alignment region to create a vacuum to detachably secure the multiple chips to the carrier after alignment;
applying an encapsulation material to the aligned multiple chips to form an encapsulated array of semiconductor devices; and
detaching the carrier from the multiple chips.

11. The method of claim 10, wherein the carrier is detached after the encapsulation material has been applied.

12. The method of claim 10, wherein the carrier is detached from the encapsulated array of semiconductor devices.

13. The method of claim 10, further comprising:
generating an electrical redistribution layer over the encapsulated array of semiconductor devices.

14. The method of claim 10, including removing the fluid from each chip alignment region from the back face via the opening extending through carrier when applying the low-pressure gas volume.

15. A method of placing an array of chips on a carrier, comprising:
providing a first carrier having multiple chip alignment regions on a front face, wherein the chip alignment regions comprise surface areas of the front face which are more hydrophilic than a remaining surface area of the front face surrounding the chip alignment regions;
disposing a fluid on the multiple chip alignment regions of the first carrier;
simultaneously placing multiple chips onto the fluid over the multiple chip alignment regions;
aligning each chip to the corresponding chip alignment region via the fluid;
applying a low-pressure gas volume from a back face of the first carrier to each of the aligned multiple chips via at least one opening extending through the first carrier from the back face to the front face to each chip alignment region to create a vacuum to detachably secure the chips to the first carrier;
placing the aligned multiple chips on a second carrier;
venting the low-pressure gas volume to release the aligned multiple chips from the first carrier; and
detaching the first carrier from the aligned multiple chips.

16. The method of claim 15, wherein the second carrier comprises an array of stacked integrated circuits or a metal alloy or a ceramic plate or a laminate.

17. A method to produce an aligned array of chips, comprising:
providing a semiconductor wafer;
attaching the semiconductor wafer to an expandable carrier;
singularizing the semiconductor wafer into multiple chips;
expanding the expandable carrier to space apart the multiple chips;
disposing a fluid onto each of multiple chip alignment regions located on a front face of a carrier, wherein the chip alignment regions comprise surface areas of the front face which are more hydrophilic than a remaining surface area of the front face surrounding the chip alignment regions;
placing the spaced apart multiple chips in parallel onto the fluid over the multiple chip alignment regions of the carrier;
aligning each chip to the corresponding chip alignment region via the fluid; and
applying a low-pressure gas volume from a back face of the carrier to each chip via at least one opening extending through the carrier from the back face to the front face to each chip alignment region to create a vacuum to detachably secure the multiple chips to the carrier after alignment.

18. The method of claim 17, wherein the expandable carrier is an expandable foil.

19. The method of claim 17, wherein the expandable carrier comprises of a first layer, a second layer and a third layer, wherein the first layer is an adhesive layer and the third layer has an elasticity higher than the elasticity of the second layer.

20. A method of manufacturing an array of semiconductor devices, comprising:
- providing a first carrier having multiple chip alignment regions, wherein the chip alignment regions comprise surface areas of the first carrier which are more hydrophilic than a remaining surface area of the first carrier surrounding the chip alignment regions, each chip alignment region including an adhesive thereon;
- disposing a fluid onto each of the chip alignment regions of the first carrier;
- placing a chip onto the fluid over each of the chip alignment regions;
- aligning each chip to the corresponding chip alignment region via a surface tension of the fluid;
- evaporating the fluid to make the adhesive on each of the chip alignment regions operative and bond the corresponding aligned chip to the alignment region;
- placing the aligned multiple chips on a second carrier;
- detaching the first carrier from the chips after placing the aligned multiple chips on the second carrier by releasing the adhesive.

21. The method of claim 20, wherein detaching the first carrier includes applying solvent to release the adhesive on each of the chip alignment regions from the chips.

* * * * *